(12) United States Patent
Manahan et al.

(10) Patent No.: US 11,967,478 B2
(45) Date of Patent: Apr. 23, 2024

(54) CIRCUIT PROTECTION DEVICES, SYSTEMS AND METHODS FOR EXPLOSIVE ENVIRONMENT COMPLIANCE

(71) Applicant: EATON INTELLIGENT POWER LIMITED, Dublin (IE)

(72) Inventors: Joseph Michael Manahan, Manlius, NY (US); Adam Ledgerwood, Syracuse, NY (US); Andrew Butler, Baldwinsville, NY (US); Graig DeCarr, Cicero, NY (US); Edmund Leubner, Liverpool, NY (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 17/591,162

(22) Filed: Feb. 2, 2022

(65) Prior Publication Data
US 2022/0328262 A1    Oct. 13, 2022

Related U.S. Application Data

(63) Continuation of application No. 16/723,389, filed on Dec. 20, 2019, now Pat. No. 11,270,854.
(Continued)

(51) Int. Cl.
*H01H 9/02* (2006.01)
*H01H 9/04* (2006.01)
(Continued)

(52) U.S. Cl.
CPC .......... *H01H 9/042* (2013.01); *H01H 71/025* (2013.01); *H05K 5/069* (2013.01); *H05K 7/20* (2013.01)

(58) Field of Classification Search
CPC ........ H01H 9/042; H01H 9/046; H01H 83/00; H01H 89/00; H01H 9/106;
(Continued)

(56) References Cited

U.S. PATENT DOCUMENTS 3,493,783 A    2/1970 Till
3,569,820 A    3/1971 Nishimuta
(Continued)

FOREIGN PATENT DOCUMENTS

AU    502105 B2    7/1979
CA    1292553 C    11/1991
(Continued)

OTHER PUBLICATIONS

English translation of CN 108630472 A, 2018 (Year: 2018).*

*Primary Examiner* — Mandeep S Buttar
(74) *Attorney, Agent, or Firm* — MERCHANT & GOULD P.C.

(57) ABSTRACT

Solid state and hybrid circuit protection devices include improved chemical, static discharge and impact resistant housing construction, arc-free switching operation, secure terminal assemblies and thermal management features. The solid state and hybrid circuit protection devices are ignition protected and avoid possible explosions and therefore obviate a need for conventional explosion-proof enclosures to ensure safe operation of an electrical power system in a potentially explosive environment.

18 Claims, 8 Drawing Sheets

Related U.S. Application Data

(60) Provisional application No. 62/784,975, filed on Dec. 26, 2018.

(51) Int. Cl.
*H01H 71/02* (2006.01)
*H05K 5/06* (2006.01)
*H05K 7/20* (2006.01)

(58) Field of Classification Search
CPC ........... H01H 2009/544; H01H 71/025; H01H 9/0264; H01H 9/52; H01H 71/08; H01H 39/00; H01H 13/06; H01H 2223/002; H01H 71/02; H02B 1/28; H02B 1/46; H02B 1/26; H05K 7/20; H05K 1/141; H05K 5/0213; H05K 5/06; H02H 1/0007; H02H 7/085
USPC .................... 361/93.1, 115, 42, 2, 1; 337/30
See application file for complete search history.

(56) References Cited

U.S. PATENT DOCUMENTS

| | | | |
|---|---|---|---|
| 3,644,790 A | 2/1972 | Kozlovic et al. | |
| 3,656,005 A | 4/1972 | Lee | |
| 3,809,985 A | 5/1974 | Krause et al. | |
| 4,019,097 A | 4/1977 | Miller et al. | |
| 4,115,829 A | 9/1978 | Howell | |
| 4,129,785 A | 12/1978 | Kadah | |
| 4,245,184 A * | 1/1981 | Billings | H03K 17/13 |
| | | | 361/93.6 |
| 4,366,463 A | 12/1982 | Barker | |
| 4,599,675 A | 7/1986 | Fisher et al. | |
| 4,710,645 A | 12/1987 | Doittau et al. | |
| 4,713,719 A | 12/1987 | Kugelman | |
| 4,740,883 A | 4/1988 | Mccollum | |
| 4,870,531 A * | 9/1989 | Danek | H01H 71/0228 |
| | | | 361/679.17 |
| 5,107,236 A * | 4/1992 | Lesslie | H01H 71/128 |
| | | | 335/17 |
| 5,162,610 A * | 11/1992 | Clifton | H05K 9/0073 |
| | | | 174/372 |
| 5,434,376 A | 7/1995 | Hyatt et al. | |
| 5,508,655 A | 4/1996 | Cederlind | |
| 5,791,485 A | 8/1998 | Carbonneau | |
| 5,818,674 A | 10/1998 | Zuzuly | |
| 5,903,139 A | 5/1999 | Kompelien | |
| 6,051,895 A | 4/2000 | Mercier | |
| 6,127,882 A | 10/2000 | Vargha et al. | |
| 6,426,632 B1 | 7/2002 | Clunn | |
| 6,515,840 B2 | 2/2003 | Covi et al. | |
| 6,603,221 B1 | 8/2003 | Liu | |
| 6,861,585 B1 * | 3/2005 | Kiely | H01R 9/2475 |
| | | | 174/53 |
| 7,304,828 B1 | 12/2007 | Shvartsman | |
| 7,323,851 B2 | 1/2008 | Markowski | |
| 7,369,386 B2 | 5/2008 | Rasmussen et al. | |
| 7,436,642 B2 | 10/2008 | Grisoni | |
| 7,468,877 B2 | 12/2008 | Oki et al. | |
| 7,643,256 B2 | 1/2010 | Wright et al. | |
| 7,656,103 B2 | 2/2010 | Shteynberg et al. | |
| 7,669,061 B2 | 2/2010 | Curt et al. | |
| 7,742,273 B1 | 6/2010 | Shvartsman et al. | |
| 7,755,414 B2 | 7/2010 | Shvartsman | |
| 7,787,223 B2 | 8/2010 | Bilac | |
| 7,869,170 B2 * | 1/2011 | Colsch | H02H 3/006 |
| | | | 361/42 |
| 7,933,126 B2 | 4/2011 | Jain | |
| 7,936,541 B2 | 5/2011 | Brusky et al. | |
| 8,023,235 B2 | 9/2011 | Bilac et al. | |
| 8,213,144 B2 | 7/2012 | Papallo et al. | |
| 8,335,062 B2 | 12/2012 | Haines et al. | |
| 8,405,939 B2 | 3/2013 | Haines et al. | |
| 8,416,541 B1 | 4/2013 | White | |
| 8,643,308 B2 | 2/2014 | Grajcar | |
| 8,687,392 B2 | 4/2014 | Sims et al. | |
| 8,779,676 B2 | 7/2014 | Simi | |
| 8,853,958 B2 | 10/2014 | Athalye et al. | |
| 9,000,678 B2 | 4/2015 | Huynh | |
| 9,093,863 B2 | 7/2015 | Hyde et al. | |
| 9,190,832 B2 | 11/2015 | Bellini et al. | |
| 9,276,401 B2 | 3/2016 | Rozman et al. | |
| 9,531,215 B2 | 12/2016 | Ewing et al. | |
| 9,557,723 B2 | 1/2017 | Nasle | |
| 9,642,226 B2 | 5/2017 | Taipale et al. | |
| 9,736,911 B2 | 8/2017 | Taipale et al. | |
| 9,742,185 B2 | 8/2017 | Wang et al. | |
| 9,755,630 B2 | 9/2017 | Urciuoli | |
| 10,079,122 B2 | 9/2018 | Kinsel et al. | |
| 10,320,177 B2 | 6/2019 | Emerson et al. | |
| 11,270,854 B2 | 3/2022 | Manahan et al. | |
| 2001/0022713 A1 * | 9/2001 | Gimenez | H01H 83/144 |
| | | | 361/42 |
| 2003/0218847 A1 | 11/2003 | Lesesky et al. | |
| 2004/0217831 A1 * | 11/2004 | Bauer | H01H 11/0031 |
| | | | 335/202 |
| 2004/0233605 A1 * | 11/2004 | Dabrowski | H04M 3/18 |
| | | | 361/118 |
| 2006/0116794 A1 | 6/2006 | Stoupis et al. | |
| 2007/0236841 A1 * | 10/2007 | Asano | H01H 73/12 |
| | | | 361/42 |
| 2007/0255460 A1 * | 11/2007 | Lopata | H02J 3/14 |
| | | | 700/299 |
| 2007/0291437 A1 | 12/2007 | Cornali et al. | |
| 2008/0100140 A1 | 5/2008 | Sorenson et al. | |
| 2010/0159823 A1 * | 6/2010 | Smith | H04B 7/155 |
| | | | 455/575.8 |
| 2010/0288467 A1 * | 11/2010 | Manahan | F28F 9/001 |
| | | | 165/104.34 |
| 2013/0066478 A1 | 3/2013 | Smith | |
| 2013/0175084 A1 | 7/2013 | Taylor | |
| 2014/0021898 A1 | 1/2014 | Hendrickson et al. | |
| 2014/0029152 A1 | 1/2014 | Mazzola et al. | |
| 2014/0211345 A1 | 7/2014 | Thompson et al. | |
| 2014/0362480 A1 | 12/2014 | Veil et al. | |
| 2015/0076904 A1 * | 3/2015 | Mills | H01H 50/021 |
| | | | 307/29 |
| 2016/0105983 A1 * | 4/2016 | Cho | H05K 1/14 |
| | | | 361/767 |
| 2016/0141123 A1 | 5/2016 | Jefferies et al. | |
| 2016/0225562 A1 | 8/2016 | Franks et al. | |
| 2016/0276116 A1 | 9/2016 | Pignier et al. | |
| 2017/0004948 A1 | 1/2017 | Leyh | |
| 2017/0098931 A1 | 4/2017 | Gerdinand et al. | |
| 2017/0194956 A1 | 7/2017 | Ugale et al. | |
| 2017/0244246 A1 | 8/2017 | Kawamoto | |
| 2017/0265316 A1 | 9/2017 | Grunow et al. | |
| 2017/0356639 A1 * | 12/2017 | Taylor | H05K 5/04 |
| 2018/0109107 A1 | 4/2018 | Mosebrook et al. | |
| 2018/0138688 A1 * | 5/2018 | Ukil | H02J 7/02 |
| 2018/0138695 A1 | 5/2018 | Wu et al. | |
| 2019/0041887 A1 | 2/2019 | Forbes, Jr. | |
| 2019/0164713 A1 * | 5/2019 | Devine | H01H 71/123 |
| 2019/0198267 A1 | 6/2019 | Zhou et al. | |
| 2020/0106259 A1 * | 4/2020 | Telefus | H03K 17/6872 |
| 2020/0106260 A1 * | 4/2020 | Telefus | H02H 3/10 |

FOREIGN PATENT DOCUMENTS

| | | |
|---|---|---|
| CA | 2162803 A1 | 5/1997 |
| CA | 2100281 C | 8/2004 |
| CA | 2310619 C | 2/2005 |
| CN | 1156977 C | 7/2004 |
| CN | 1614840 A | 5/2005 |
| CN | 201937887 U | 8/2011 |
| CN | 202978872 U | 6/2013 |
| CN | 106099841 A | 11/2016 |
| CN | 106532457 A | 3/2017 |
| CN | 106549329 A | 3/2017 |
| CN | 103384054 B | 11/2017 |
| CN | 106169708 B | 12/2017 |
| CN | 108630472 A * | 10/2018 |

(56) References Cited

FOREIGN PATENT DOCUMENTS

| | | |
|---|---:|---:|
| DE | 69818311 T2 | 10/2003 |
| DE | 102012110001 A1 | 4/2014 |
| EP | 0016646 A1 | 10/1980 |
| EP | 0754369 A1 | 1/1997 |
| EP | 1550216 A2 | 7/2005 |
| EP | 1883830 B1 | 11/2012 |
| EP | 2843836 A1 | 3/2015 |
| EP | 2843837 A1 | 3/2015 |
| FR | 2353130 A1 | 12/1977 |
| FR | 2999792 A1 | 6/2014 |
| GB | 1466313 A | 3/1977 |
| GB | 1548287 A | 7/1979 |
| GB | 2244876 A | 12/1991 |
| IN | 217801 B | 4/2008 |
| IN | 201634043598 A | 7/2017 |
| KR | 2010040819 A | 4/2010 |
| KR | 2010044760 A | 4/2010 |
| SU | 597040 A1 | 3/1978 |
| WO | 1992003866 A1 | 3/1992 |
| WO | 2002088852 A2 | 11/2002 |
| WO | 2011071486 A1 | 6/2011 |

\* cited by examiner

CIRCUIT PROTECTION DEVICES, SYSTEMS AND METHODS FOR EXPLOSIVE ENVIRONMENT COMPLIANCE

CROSS REFERENCE TO RELATED APPLICATIONS

This application is a Continuation application of U.S. application Ser. No. 16/723,389 filed Dec. 20, 2019, now U.S. Pat. No. 11,270,854, which claims the benefit of U.S. Provisional Application Ser. No. 62/784,975 filed Dec. 26, 2018, the complete disclosures of which are hereby incorporated by reference in their entirety.

BACKGROUND OF THE INVENTION

The field of the invention relates generally to electrical circuit protection devices, and more specifically to improved electrical circuit protection devices meeting or exceeding applicable safety standards for operation in potentially explosive environments.

Various different types of circuit protection devices exist to meet the needs of electrical power systems providing electrical power to various electrical loads. For example, various different devices and assemblies are known that provide disconnect functionality between a power supply circuit and an electrical load. With such devices, output power may be selectively switched from a power supply either manually or automatically through such devices to facilitate service and maintenance of the electrical power system as well as to address overcurrent and/or electrical fault conditions. Circuit breaker devices and fusible disconnect switch devices are two well-known types of devices that each provide a different capability to respond to overcurrent and electrical fault conditions and electrically isolate load-side electrical equipment from line-side power supply circuitry, thereby protecting the load-side equipment and circuitry from otherwise damaging overcurrent conditions in the electrical power system.

While known circuit protector disconnect devices are available to meet the needs of many electrical systems, they remain disadvantaged in some aspects for certain types of electrical systems and applications in which the circuit protectors are located in explosive environments in hazardous locations. Existing circuit protector disconnect devices therefore have yet to completely meet the needs of the marketplace. Improvements are accordingly desired.

BRIEF DESCRIPTION OF THE DRAWINGS

Non-limiting and non-exhaustive embodiments are described with reference to the following Figures, wherein like reference numerals refer to like parts throughout the various drawings unless otherwise specified.

DETAILED DESCRIPTION OF THE INVENTION

Figure 1:
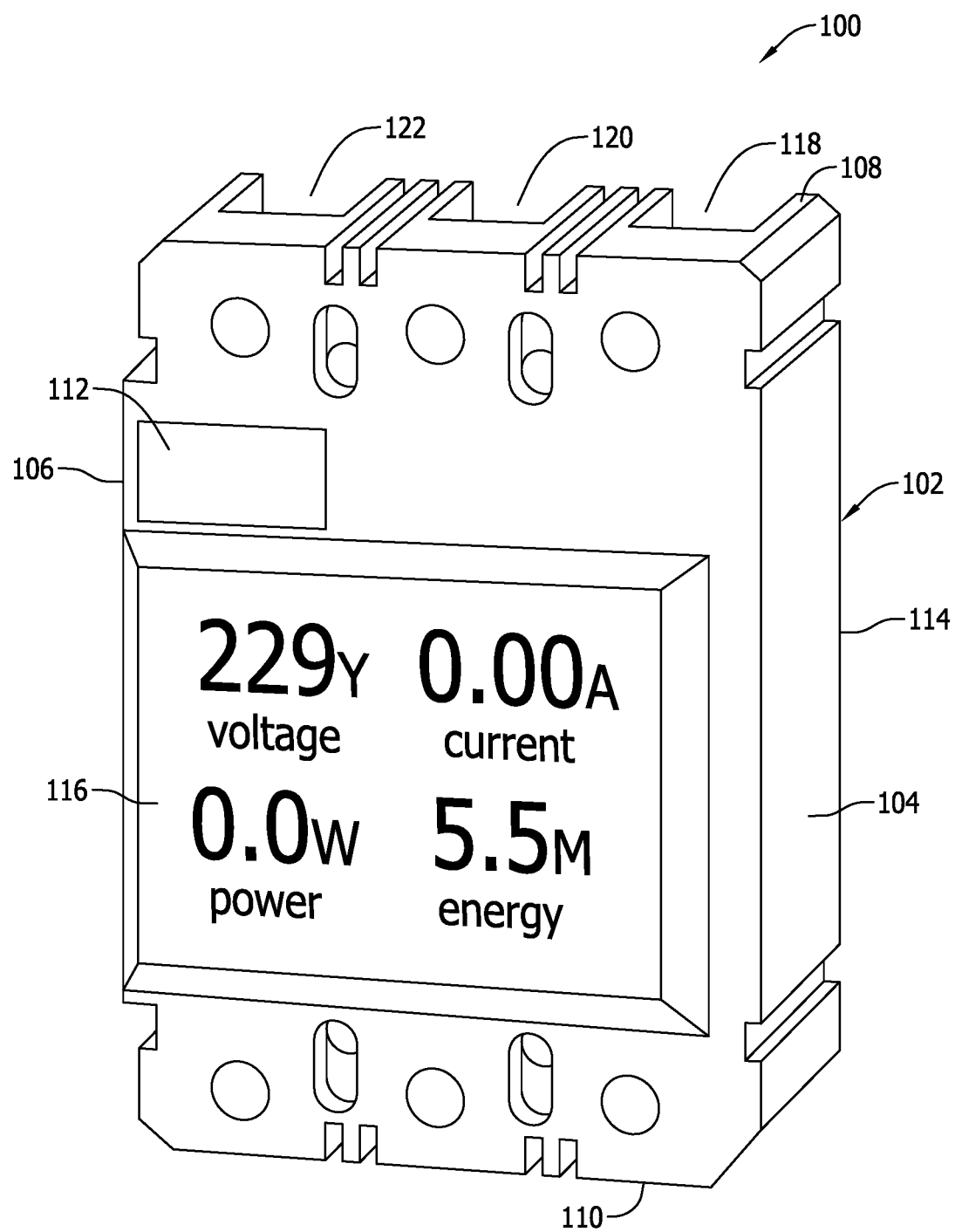
FIG. 1 is a perspective view of a compliant, explosive location circuit protection device according to a first exemplary embodiment of the invention.

In order to understand the inventive concepts described herein to their fullest extent, set forth below is a discussion of the state of the art as it relates to issues posed by electrical power systems operating in explosive environments in hazardous locations, followed by exemplary embodiments of devices, systems and methods addressing such issues and meeting longstanding but unfulfilled needs in the art.

I. State of the Art

Electrical power systems sometimes operate within hazardous environments presenting a risk of explosion via ignition of a surrounding gas or vapor dusts, fibers, or flyings. Such hazardous environments may arise in, for example only, petroleum refineries, petrochemical plants, grain silos, wastewater and/or treatment facilities among other industrial facilities, operating with sustained volatile conditions in the ambient environment and presenting a heightened risk of fire or explosion. A sustained presence of airborne ignitable gas, ignitable vapors or ignitable dust, or otherwise flammable substances presents substantial concerns regarding safe and reliable operation of such facilities overall, including but not limited to safe operation of the electrical power system itself, which in some instances by virtue of conventional circuit protector devices may produce ignition sources in normal operation and in the presence of an electrical fault. As such, a number of standards have been promulgated relating to electrical product use in explosive environments to improve safety in hazardous locations in view of an assessed probability of explosion or fire risk.

For example, Underwriter's Laboratories ("UL") standard UL 1203 sets forth Explosion-Proof and Dust-Ignition-Proof Electrical Equipment criteria for hazardous locations. Explosion-Proof and Dust-Ignition-Proof enclosures are presently available to enclose or contain electrical products, including but not necessarily limited to circuit protection devices that are not themselves Explosion-Proof or Dust-Ignition-Proof. In combination with appropriate Explosion-Proof and Dust-Ignition-Proof enclosures, electrical equipment manufacturers may receive UL certification of compliance with the applicable rating standards for hazardous locations, and UL certification is an important aspect of a manufacturer's ability to successfully bring products to market in North America or any other market accepting of UL standard UL 1203.

The National Electric Code (NEC) generally classifies hazardous locations by class and division. Class I locations are those in which flammable vapors and gases may be present. Class II locations are those in which combustible dust may be found. Class III locations are those which are hazardous because of the presence of easily ignitable fibers or flyings. Considering Class I, Division 1 covers locations where flammable gases or vapors may exist under normal operating conditions, under frequent repair or maintenance operations, or where breakdown or faulty operation of process equipment might also cause simultaneous failure of electrical equipment. Division 1 presents a greater risk of explosion than, for example, Division 2 where flammable gases or vapors are normally handled either in a closed system, confined within suitable enclosures, or are normally prevented by positive mechanical ventilation.

Given that electrical devices can be ignition sources in certain circumstances, explosion-proof, flame-proof, or ignition proof enclosures are conventionally provided in NEC Division 1 locations to house electrical circuit protection devices as described next. The terms "explosion-proof" or "flame-proof" in this context, refer to enclosures that are designed to be capable of containing an internal explosion of a specified flammable vapor-air mixture. In addition, the explosion-proof enclosure must operate at a safe temperature with respect to the surrounding atmosphere.

Conventional circuit breaker devices, switch devices of various types, and contactor devices are known to include input terminals connectable to power supply or line-side circuitry, output terminals connectable to one or more electrical loads, and pairs of mechanical switch contacts between the respective input terminals and output terminals. Each pair of mechanical switch contacts typically includes a stationary contact and a movable contact linked to an actuator element that displaces the movable contact along a predetermined path of motion toward and away from the stationary contact to connect and disconnect a circuit path through the device and therefore electrically connect or disconnect the input and output terminals. When the switch contacts are opened, the device serves to isolate the electrical load(s) connected to the output terminals from the power supply connected to the input terminals. The actuator element in the mechanical switch devices described above may be automatically movable for circuit protection purposes to open the mechanical switch contacts in response to overcurrent or fault conditions in the line-side circuit and electrically isolate the electrical load(s) from electrical fault conditions to prevent them from being damaged, or the actuator element may be manually movable to electrically isolate the electrical loads from the line-side power source for energy conservation, maintenance of the load, etc.

Circuit breakers and fusible disconnect switch devices are two well-known types of devices that each provide a different type of disconnect functionality and circuit protection via mechanical switch contacts. The International Electrotechnical Commission (IEC) includes the following pertinent definitions:

2.2.11
circuit-breaker
mechanical switching device, capable of making, carrying and breaking currents under normal circuit conditions and also making, carrying for a specified time and breaking currents under specified abnormal circuit conditions such as those of short circuit [441-14-20]
2.2.9
switch (mechanical)
mechanical switching device capable of making, carrying and breaking currents under normal circuit conditions which may include specified operating overload conditions and also carrying for a specified time currents under specified abnormal circuit conditions such as those of short circuit [441-14-10]
NOTE A switch may be capable of making but not breaking short-circuit currents.

2.2.1
switching device
device designed to make or break the current in one or more electric circuits [441-14-01]
NOTE A switching device may perform one or both of these operations.

It is seen from the above definitions that the circuit breaker as defined in IEC 2.2.11 and the mechanical switch as defined in IEC 2.2.9 differ in their capability to mechanically respond to abnormal circuit conditions. Specifically, the circuit breaker as defined in IEC 2.2.11 can mechanically break short circuit conditions whereas the mechanical switch of IEC 2.2.9 cannot. Because of this, an electrical fuse is sometimes used in combination with the mechanical switch of IEC 2.2.9 to realize a fusible disconnect switch that can respond to a short circuit condition via operation of the fuse (i.e., an opening of the fuse) instead of operation of the mechanical switch contacts.

In either of the devices of IEC 2.2.11 and 2.2.9, the automatic circuit protection may sometimes be provided solely via the structural design and calibration of the circuit breaker structure or the structure of the fuse element(s) in the fuse provided that each realize predetermined time-current characteristics before opening of the circuit. The NEC has defined these two basic types of Overcurrent Protective Devices (OCPDs) as follows:

fuse—An overcurrent protective device with a circuit-opening fusible part that is heated and severed by the passage of overcurrent through it.
circuit breaker—A device designed to open and close a circuit by nonautomatic means and to open the circuit automatically on a predetermined overcurrent without damage to itself when properly applied within its rating.

The NEC also requires that circuits be provided with a disconnecting means, defined as a device, or group of devices, or other means by which the conductors of a circuit can be disconnected from their source of supply. Since fuses are designed to open only when subjected to an overcurrent, they generally are applied in conjunction with a separate disconnecting means (NEC Article 240 requires this in many situations), typically some form of a disconnect switch. Since circuit breakers are designed to open and close under manual operation as well as in response to an overcurrent, a separate disconnecting means is not required.

In some types of circuit protection devices, automatic circuit protection may be realized via electrical sensors included in the device to monitor actual circuit conditions and, in response to predetermined circuit conditions as detected by the sensors, electromechanical trip features may be actuated to automatically open the movable contacts in response to detected overcurrent conditions including overload and short circuit conditions. Once tripped, the circuit breaker may be reset or reclosed to restore affected circuitry through the switch contacts as the circuit breaker is designed to open the circuit without damage to itself, whereas as fuse opens a circuit via internal degradation of the fuse element(s) to the point where they can no longer carry electrical current. As such, the fuse must be replaced after opening to restore affected circuitry. Combinations of circuit breakers and fuses are also desirable in some instances, with selective coordination thereof, to extend the range of overcurrent conditions that may be addressed as well as to improve response times.

In contrast to the circuit protection devices as described above, the "switching device" of IEC 2.2.1 as defined above refers merely to making and breaking of current, without any reference to making or breaking overcurrent conditions (i.e., overload conditions or short circuit conditions). IEC 2.2.1 also does not require a mechanical switching device at all, but to the extent that a switch device that is not a circuit breaker device actually includes mechanical switch contacts it could present an ignition risk when located in hazardous environments.

Specifically, an operation of mechanical switch contacts to make or break an energized circuit, whether manually actuated by a user under normal circuit conditions or automatically undertaken under abnormal circuit conditions, presents a possible ignition source in a hazardous environment. Specifically, as the movable contacts are mechanically displaced away from stationary contacts from a closed position to an opened position, electrical arcing between the switch contacts tends to result. Similar arcing tends to occur as the movable contacts are moved back toward the stationary contacts to reclose the device. If such arcing between the switch contacts is realized in the presence of a combustible gas, vapor or substance, the arcing may ignite the gas, vapor or substance. While the mechanical switch contacts are typically enclosed in housings provided with conventional circuit breakers or other mechanical switch devices as well as additional enclosures commonly utilized with panelboards or motor control centers, etc. such housings and enclosures are typically not sufficient to isolate electrical arcing from ignitable, airborne elements. For this reason, known devices including mechanical switch contacts are conventionally located in individual explosion-proof enclosures and again contained in an environmental enclosure, or a system of switches (i.e., a panelboard) can be installed in a single large explosion-proof enclosure without individual explosion-proof enclosures for the switches provided within an NEC Division 1 location to provide the necessary protection.

Of the devices described thus far, circuit breakers, while mechanically breaking a short circuit condition, experience the most intense arcing conditions and therefore have the greatest potential in terms of raw energy and temperature to ignite combustible gases, vapors or substances in an explosive, hazardous environment. Considering that many industrial power systems and loads operate at relatively high voltage and high current, arc energy and arc temperatures in lower current overload conditions and normal conditions is likewise considerable and poses ignition risks. In general, ignition energy resulting from the fault energy is related to the magnitude of the current being interrupted, so the higher the current being interrupted the greater the arcing potential and severity. For example, a 65 kAIC interruption is much more significant from the arcing perspective, and hence more hazardous, than a 10 kAIC interruption.

Available explosion-proof, flame-proof or ignition-proof enclosures are effective to provide safe operation of mechanical switch devices in the NEC Division 1 location, but impart additional costs, occupy valuable space in the electrical power system, and impose certain burdens to an installation and servicing of an electrical power system over time. Obtaining access to the disconnect devices inside the explosion-proof enclosures typically requires a time consuming removal of a number of fasteners, and after any maintenance procedures are completed all the fasteners must be properly replaced to ensure the desired safety of the explosion-proof enclosure. During maintenance procedures, the area in which the disconnect devices are located are also typically decommissioned (i.e., disconnected) with associated load-side processes shut down to ensure safety during the maintenance procedure. Such decommissions are costly from the perspective of the industrial facility, and limiting or shortening decommissioned downtime is important. It would therefore be desirable in some cases if the explosion-proof enclosures could be eliminated in NEC Division 1 location while still providing safe disconnect functionality in hazardous environments. In order to do so, circuit protection devices designed to reduce ignition risks are needed, but at present generally do not exist.

Solid state disconnect devices are known that provide desirable disconnect functionality via semiconductor switches or semiconductor devices such as, but not limited to, insulated-gate bipolar transistors (IGBTs), Metal Oxide Semiconductor Field Effect Transistors (MOSFETs) and other known elements that electronically operate in a known manner to preclude current flow through the device and therefore electrically isolate line-side circuitry from load side circuitry in response to predetermined circuit conditions without utilizing mechanical switch contacts. Such solid state switches may be implemented in circuit breaker devices or used in combination with fuses to address electrical fault conditions in an automatic manner.

Solid state switches beneficially eliminate electrical arcing associated with displacement of mechanical switch contacts as described above, but nonetheless still present possible ignition sources via heat generated by the solid state switches in use. Depending on the type and concentration of combustible elements in the hazardous location, the surface temperature of the solid state switch devices may rise to the point where spontaneous ignition may occur due to the flash temperature of the specific gas or ignitable substance in the hazardous location, even though no arcing occurs in the switching operation of the device.

Connecting terminals of solid state switch devices may also present reliability issues and possible ignition sources when used in NEC Division 1 location. More specifically, the terminals may tend to loosen over time when subjected to thermal cycling or vibration. Loose terminal connections may cause overheating and possible ignition sources, if not electrical arcing, under certain conditions at the locations of the terminals. Poor quality connections at the terminal may also cause overheating of the conductor structure (sometimes referred to as the bus) in the device, presenting still further ignition concerns in hazardous locations. As such, the use of known solid state switching devices, without more, does not itself ensure sufficient safety in hazardous locations without complementary use of an explosion-proof enclosure in NEC Division 1 location.

So-called hybrid disconnect devices are also known that include a combination of semiconductor switches or semiconductor devices and mechanical switch contacts. Such hybrid devices may likewise be implemented in circuit breaker devices or used in combination with fuses to address electrical fault conditions in an automatic manner. Hybrid disconnect devices present a mix of the issues discussed above from the perspective of possible ignition sources in an explosive and hazardous environment, and adequate safety in the absence of a complementary use of an explosion-proof enclosure in NEC Division 1 locations cannot be ensured.

II. Inventive Arc-less Devices, Systems and Methods for Hazardous Location Compliance.

Exemplary embodiments of circuit protection devices are described herein that overcome the problems above and provide an enhanced degree of safety for compliance with the applicable standards in NEC Division 1 locations without necessarily requiring a separately provided explosion-proof, flame-proof or ignition-proof enclosure, thereby advantageously lowering electrical power system installation costs, saving valuable space in electrical panels, control centers, and the like while facilitating a more efficient maintenance and oversight of the electrical power system. Method aspects will be in part explicitly discussed and in part apparent from the following description.

In one aspect, exemplary circuit protection devices may be implemented in the form of a solid state switch device having arc-less operation in switching of the device to connect or disconnect load side circuitry through the solid state switch device, in combination with enhanced housing features to provide needed chemical resistance for explosive environments to ensure structural integrity despite exposure to harsh chemicals, thermal management features to avoid possible ignition source via overheating of the device housing, thermal management features to address potential overheating of conductors in the solid state switch device, and improved terminal and termination structures to eliminate ignition sources posed by the terminal connections to the device. When implemented in the form of a solid state circuit breaker device, such solid state circuit breakers, unlike conventional circuit breakers, therefore comply with hazardous location standards applicable to NEC Division 1 locations and render conventional explosion-proof, flameproof or ignition-proof enclosures obsolete for certain applications.

In another aspect, a hybrid circuit protection device may be implemented in the form of a combination solid state switching device and a mechanical switch device, and also in combination with enhanced features to isolate electrical arcing between the mechanical switch contacts from the explosive ambient environment to prevent ignition, provide the necessary chemical and impact resistance, address possible ignition sources at the connection terminals and/or provide thermal management features to avoid potential overheating of conductive elements internal to the hybrid device or the housing of the hybrid device. Such hybrid circuit protection devices, unlike conventional hybrid circuit protection devices, therefore comply with hazardous location standards applicable to NEC Division 1 locations and render conventional explosion-proof enclosures obsolete for certain applications.

While the following discussion is made in the context of circuit breaker devices, the inventive concepts below are not necessarily limited to circuit breaker devices and instead may broadly accrue to other types of devices, examples of which are discussed above, that present similar issues from the perspective of ignition concerns in a hazardous location. Likewise, while the inventive concepts are described in the context of hazardous locations such as NEC Division 1 locations, the benefits of the concepts described are not necessarily limited to NEC Division 1 locations and instead may more broadly apply to other types of hazardous environments, and in some aspects may be beneficially provided for use in non-hazardous locations as desired.

FIG. 1 is a perspective view of a compliant, explosive environment circuit protection device 100 according to a first exemplary embodiment of the invention. The circuit protection device 100 includes a housing 102 having opposing longitudinal sides 104, 106 and opposing lateral sides 108, 110 arranged generally orthogonally with respect to the longitudinal sides 104, 106. The housing 102 also includes a front side 112 and a rear side 114, and the front side 112 may include an optional digital display 116 that functions as a user interface for the device 100. As shown the display 116 visually indicates voltage, current, power and energy readings to a person in the vicinity of the device 100 and display 116.

The housing 102 of the device 100 is fabricated from strategically selected or otherwise custom formulated materials to withstand all possible electrical operating conditions, and specifically all possible electrical fault conditions including simultaneous fault conditions that may be presented by the electrical power system being protected. The housing structure and housing material must likewise be formulated to provide adequate strength to withstand shock and impact forces that may be realized in an explosive environment, as well as to provide chemical resistance to withstand exposure to chemicals in the explosive environment that could otherwise negatively impact the integrity of the device 100.

As used herein, "chemical resistance" refers to the strength of the housing material to protect against chemical attack or solvent reaction. Chemical resistance in the housing 102 is the opposite of chemical reactivity that may cause an undesirable chemical effect when the housing 102 is exposed to certain chemicals and/or that my undesirably generate heat and raise the temperature of the housing 102. Chemical resistance, via little or no reactivity to specified chemicals, relates to the resistivity of the housing 102 to corrosive or caustic substances in the environment, including but not limited to airborne gases and vapors. For the device 100, chemical resistance is important to all materials and structure that contributes to the hazardous location compliance described herein.

UL 1203 defines chemical testing that may be applied to determine whether any formulation of a candidate material for the housing 102 is chemically resistant for explosive environment locations. Specifically, UL 1203 chemical testing requires sample housings to be fabricated from the formulation of candidate material in the housing structure desired, and a lengthy exposure of the sample housings to saturated vapors in the air including a number of specified chemicals for a predetermined period of time. The specified chemicals for UL 1203 chemical testing include acetic acid, acetone, ammonium hydroxide, ASTM reference fuel C, diethyl ether, ethyl acetate, ethylene dichloride, furfural, n-hexane, methyl ethyl ketone, methanol, 2-nitropropane, and toluene. Different sample housings are exposed to each chemical for a predetermined period of time, and after exposure to each chemical, the sample housings are inspected to ensure that the housing structure of the samples is not compromised or shows signs of degradation via, for example, discoloration, swelling, shrinking, crazing, cracking, leaching, or dissolving. Sample housings that pass inspection are then subjected to a crush test and compared to the results of crush testing prior to the chemical exposure. If the crushing force of the chemically tested sample housings shows that the chemically tested sample housings withstand at least 85% of the corresponding crush force as tested prior to the chemical exposure, the sample housings are UL 1203 compliant.

The housing 102, via the material from which it is fabricated, should likewise exhibit chemical compatibility with specific chemicals present in a given explosive location. Chemical compatibility refers to the stability of the housing when exposed to substances in the explosive environment. If the housing chemically reacts to a substance in the environment, it is considered incompatible. While it is probably unlikely that a UL 1203 compliant housing material would exhibit such incompatibility for a specific installation, testing is nonetheless advisable to confirm chemical compatibility in view of the number of different corrosive or caustic chemicals and substances used across the spectrum of industrial facilities. Different facilities involving different caustic or corrosive substances may demand housings of different materials to address issues presented. Strategic selection and custom formulation of housing materials may be needed for some explosive environments if a universally optimal housing or material formulation cannot be practically determined or economically provided.

The material used to fabricate the housing 102 may likewise be strategically selected or otherwise formulated, as well as formed with specific structure, to achieve thermal management and surface temperature goals for the device 100 in operation. Some housing materials may exhibit better thermal performance to distribute and dissipate heat than other materials. For example, specific polymeric resins may be selected or customized, and formulated or processed to realize a housing 102 that will improve thermal performance of the device 100 in use when protecting the electrical power system, both internally to the housing 102 and on its outer surface area such that the outer surface area temperature is maintained at a level below the temperature which could cause ignition in the explosive environment.

For any given housing material, the shape and form factor of the housing 102, including dimensions, contours, etc. may vary the overall thermal performance and surface temperature positively or negatively. For instance, for a given device rating and operating voltage and current of the electrical power system, a housing having a larger outer surface area will generally reduce surface temperature in use as compared to a housing having a smaller surface area. The housing structure can be designed to optimize and balance overall package size and configuration with thermal performance.

In some embodiments, the housing 102 may be fabricated from metal or metal alloys, non-metallic insulative materials such as high strength, high performance plastics, or combinations of metallic and non-metallic materials to vary thermal performance and the other considerations above, namely impact resistance and chemical resistance. Encapsulated housing constructions, in whole or in part, are likewise possible. In some instances, the interior of the housing 102 may likewise be filled in whole or in part with dielectric material, dielectric fluid, potting materials, or other filler media such as sand to contain, absorb or dissipate heat and energy of energized electrical conductors and switch components in the device 102 to ensure that the surface temperature of the housing 102 will remain below a selected target temperature to provide a device 100 having a desired temperature classification or temperature rating.

Apart from the materials utilized in its fabrication, the structure of the housing 102 could likewise be designed with heat distribution and dissipation in mind. The housing can be structured strategically to include more than one housing material throughout or at specifically targeted locations in the housing 102. Housing sub-structures could be independently fabricated and provided for assembly to provide additional thermal insulation or thermal conductivity in desired areas of the housing to selectively confine and distribute heat in a strategic manner in select locations. Wall thickness of the housing 102 could likewise be varied to provide greater or lesser degrees of thermal conductivity and heat dissipation in selected portions of the structure or in certain areas of the housing structure at the most desirable locations. Piping, channels, or pockets may be formed to strategically capture generated heat and direct it more efficiently to desired locations for dissipation. Heat sink materials and the like may be included to improve thermal absorption and dissipation.

Active cooling elements are likewise possible in which cooling fluids are passed over or through the housing structure, with the housing structure including appropriate structure to facilitate active cooling. Active cooling elements could be self-contained or separately provided such as in a panelboard application where a number of devices 100 may be provided, with an active cooling system countering the cumulative generation of heat in closely positioned devices 100 and alleviating temperature effects that the devices 100 may have upon one another. The active cooling system may include cooling fans or pumps which circulate fluids in or around a number of devices 100 to effectively manage surface temperatures. The devices 100 including temperature sensors 158 (FIG. 3) may provide feedback signals to an active cooling system to power on when needed and otherwise be powered off. Thermistors may also be deployed with feedback loops with the load equipment to reduce available current through the device (thereby reducing heat). Thermal electrics could be used as an alternative to the fan/pump cooling methods previously described.

The above thermal management considerations may be pursued in various different combinations, some of which may counteract or obviate a need for other of the considerations. For example, active cooling in some applications may obviate a need for certain features of the housing described, such as a more sophisticated shape and form factor to dissipate heat over a relatively complex surface area.

The lateral sides 108, 110 of the housing 102 each include connection recesses 118, 120, 122 for respective connection to line-side and load-side circuitry. In the example shown in FIG. 1, three connection recesses 118, 120, 122 are provided for respective connection to a three phase power supply on one of the sides 108, 110 and to three phase load-side equipment on the other. The power supply and load may each operate with alternating current (AC) or direct current (DC). The device 100 as shown is configured as a circuit breaker and therefore provides automatic circuit protection in response to predetermined overcurrent conditions, which may be selected by the user within a certain range and input to the device 100 via the display screen 116, via another user interface including a remote interface, and/or pre-programmed into the device. The device 100 may operate according to specified time-current curves or trip profiles suitable to provide adequate protection for connected loads.

The display 116 may be multi-functional to display different screens in response to user activation. In some embodiments the display 116 may be touch sensitive with the user making selections via touching selected areas of the display as prompted. Input selectors such as buttons, knobs, etc. may be separately supplied from the display 116 for interactive by a user in relation to the display. An input selector such as a toggle switch may also be provided separately from the display 116 to serve as manually operable on/off switches that may intuitively be manually operated by a user. The toggle switch may emulate a traditional toggle switch to affect a change of state to "on" or "off", but it does so without a displacement of mechanical switch contacts because, as explained below, the device 100 does not include mechanical switch contacts.

Alternatively, an on/off feature may be built into the display 116 for convenient use by an operator to achieve disconnect switch functionality to connected load side equipment. It is recognized, however, that the display or array of displays 116 can be considered optional in certain embodiments and need not be included at all. In further embodiments, additional input/output elements may be provided, whether in the form of a display or other interfaces for user interaction with the device both locally and remotely.

Figure 2:
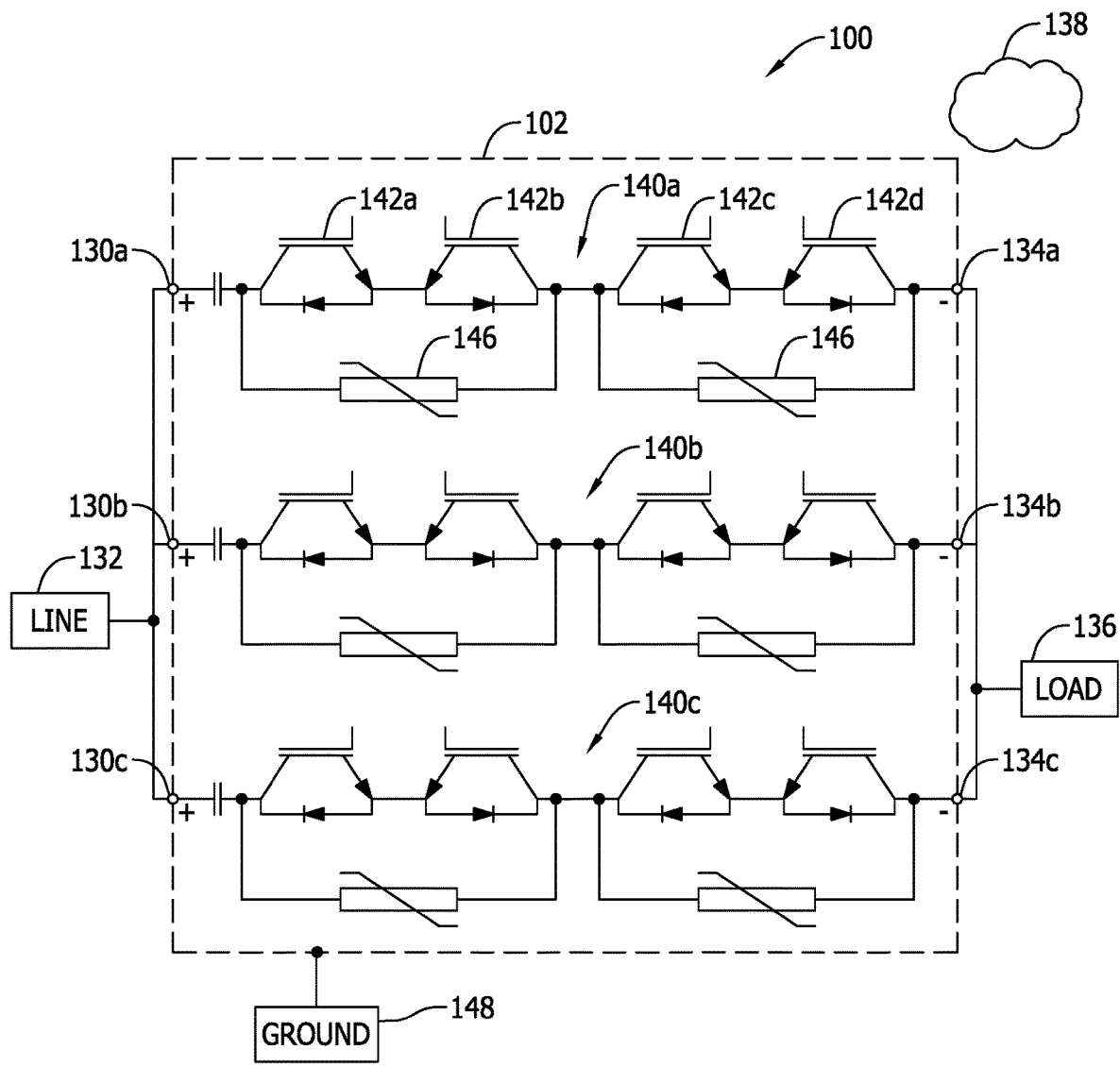
FIG. 2 is a simplified schematic diagram of the circuit protection device shown in FIG. 1 in an exemplary solid state configuration.

FIG. 2 is a simplified schematic diagram of the circuit protection device 100 in an exemplary solid state configuration. The device 100 includes input terminals 130a, 130b, 130c each connected one phase of a three phase power supply indicated as line-side circuitry 132 in FIG. 2 via connecting cables, conduits, or wires. The device 100 further includes output terminals 134a, 134b, 136c each connected to load-side circuitry 136 such as motors, fans, lighting devices, and other electrical equipment in an industrial facility wherein ignitable gas, vapors or substances may be airborne as indicated at 138. The output terminals 134a, 134b, 136c may likewise connect to the electrical loads via connecting cables, conduits, or wires. Optionally, the device 100 may further include additional elements such as auxiliary contacts and auxiliary connections, shunt trip features, undervoltage release features, communication ports and communication elements, power ports for communication and other purposes, etc.

In view of the explosive environment in which the device 100 is to be used, reliable termination of the cables to the input and output terminals is important as loose connections can generate heat and reliability issues, as well as possible ignition concerns in the explosive location. As such, cable connectors such as cable glands, described further below, may provide secure connections to ensure the safety of the device 100 in operation.

In between each pair of input terminals 130a, 130b, 130c and output terminals 134a, 134b, 136c are solid state switch devices arranged as indicated at 140a, 140b and 140c. The exemplary arrangement solid state switch arrangement 140a, 140b, 140c each includes series connected pairs 142a, 142b, 142c, 142d of insulated-gate bipolar transistors (IGBTs) respectively connected in reverse to one another, with each pair 142a and 142b and 142c and 142d including a varistor element 146 connected in parallel to the IGBTs. The reversed connected IGBTs in each pair precludes reverse current flow through the IGBTs from the load-side circuitry 136 to the line-side circuitry 132 in a known manner.

The IGBTs 142a, 142b, 142c, 142d in each solid state switch arrangement 140a, 140b, 140c are one form of a semiconductor switch that is operable to either permit current flow between the respective input and output terminals 130a and 134a, 130b and 134b, and 130c and 134c from the line-side circuitry 132 to the load-side circuitry 136, or to preclude current from flowing through the device 100 such that the load-side circuitry 136 becomes electrically isolated from the line-side circuitry 132. Briefly, a positive voltage applied from the emitter to gate terminals of the IGBT causes electrons to be drawn toward the gate terminal across a body region thereof. If the gate-emitter voltage is at or above a threshold voltage, enough electrons are drawn toward the gate to form a conductive channel across the body region, allowing current to flow from the collector to the emitter. If the gate-emitter voltage is below the threshold voltage essentially no current can flow across the body region, such that by controlling the gate-emitter voltage current flow between the input and output terminals may be enabled or disabled to connect or disconnect the output terminals from the input terminals of the device 100 via the IGBTs. Equivalent types of semiconductor switch elements other than IGBT elements may likewise be employed, including, but not limited to, equivalent types of semiconductor switch elements such as Metal Oxide Semiconductor Field Effect Transistor (MOSFET) elements, bipolar transistor elements, silicon controlled rectifier elements (sometimes referred to as thyristors), and the like. The number of semiconductor switch elements may be varied to be greater or less than the number shown in FIG. 2.

The varistor elements 146, connected in parallel to each pair of IGBTs in the arrangement shown, exhibit a relatively high resistance when exposed to a normal operating voltage, and a much lower resistance when exposed to a larger voltage, such as is associated with over-voltage conditions and/or electrical fault conditions. The impedance of the current paths through the varistors 146 are substantially lower than the impedance of the IGBTs when the varistors operate in a low-impedance mode, and is otherwise substantially higher than the impedance of the IGBTs. This means that in normal conditions the high impedance of the varistors causes all of the current to flow through the IGBTs, but as over-voltage conditions arise the varistors switch from the high impedance mode to the low impedance mode and shunt or divert over-voltage-induced current surges away from the IGBTs to the load-side circuitry 136. As over-voltage conditions subside, the varistors 146 may return to a high impedance mode. The varistors 146 beneficially allow, for example, motor inrush currents to flow through the device 100 while otherwise permitting the IGBTs to respond to overcurrent conditions after motor starting is complete. In other applications, however, the varistors 146 may be considered optional and may be omitted.

As a further thermal management feature, the solid state switch devices 140a, 140b and 140c may be encapsulated with a strategically selected or otherwise formulated material to improve thermal performance of the switch devices 140a, 140b and 140c and/or improve heat dissipation and distribution in use. The encapsulation material of the solid state switch devices 140a, 140b and 140c may be the same or different from encapsulation materials included in the housing construction, and specifically are targeted to control or limit the operating temperature of the silicon in the solid state switch devices in normal circuit operation or in overcurrent conditions and electrical fault conditions to prevent overheating of the switch devices themselves or overheating of the housing 102.

While exemplary solid state switching arrangements are shown and described, others are possible to achieve solid state switching functionality in an arc-less manner. As discussed above, the solid state switching devices avoid the type of arcing that mechanical switches produce, and therefore avoid such arcing from being a possible ignition source in the explosive environment.

To address possible static electricity charge buildup, the housing 102 is shown in FIG. 2 with connection to electrical ground 148. Briefly, static electricity is the result of an electromagnetic imbalance between negative and positive charges in an object. Charging of the housing surface may arise via surface charge involving another object, particularly for insulative portions of the housing, or via charge induction for electrically conductive portions of the housing. Surface charging can also occur during exposure to a high voltage DC power supply, which will cause ions to adhere to the housing surface.

Regardless of how surface charging actually arises, the connection to ground 148 allows any electrical charge buildup on the housing 102 to safely dissipate without creating an ignition source in combustible/hazardous areas. The housing 102 may be grounded to earth ground or chassis ground via a line wire or line conductor connected to the housing 102 on its outer surface. As such, any charging of the exterior of the housing 102 will be quickly dissipated as electrical current to ground and obviate a high voltage discharge event, typically via a spark or shock that could be generated by a person or tool utilized by a person, that could otherwise occur in the presence of the explosive atmosphere and cause ignition.

The housing 102 itself could also be fabricated in whole in part from antistatic polymers or antistatic materials that are weakly conductive to electricity from the perspective of charge buildup, but nonetheless considered insulative and non-conductive from the perspective of the electrical power system that the device 100 is protecting. Antistatic materials may improve the housing performance relative to non-antistatic materials by reducing any tendency of the housing to charge in the first instance, and this is another consideration for strategically selecting or otherwise formulating the material(s) to be utilized in the housing fabrication. Antistatic coatings, encapsulants, or shells may be provided on the housing outer surface if desired, although chemical resistance and compatibility must still be ensured as discussed above. When the device 100 directly connects to an enclosure/system ground plane in an actual installation, dedicated ground conductors to address static electricity issues may not be necessary due to mechanical attachment and/or physical proximity to the ground plane.

While a single ground connection is shown in FIG. 2, more than one ground connection could be provided in the structure of the device 100 at any desired location. Grounding conductors may be provided interior to the device housing 102 in addition to or in lieu of a grounding conductor connecting to the exterior of the device housing 102 as described. Ground connections for the housing 102 also could be established via a cable connector such as a cable gland when armored cable that already includes a ground path to earth is utilized to make the line-side and load-side connections to the terminals 130a, 130b, 130c of the device 100. Of course, in some cases, non-armored cable could be used, with or without cable glands, while still eliminating ignition sources in the device 100 and addressing static electricity with an alternative ground connection.

Figure 3:
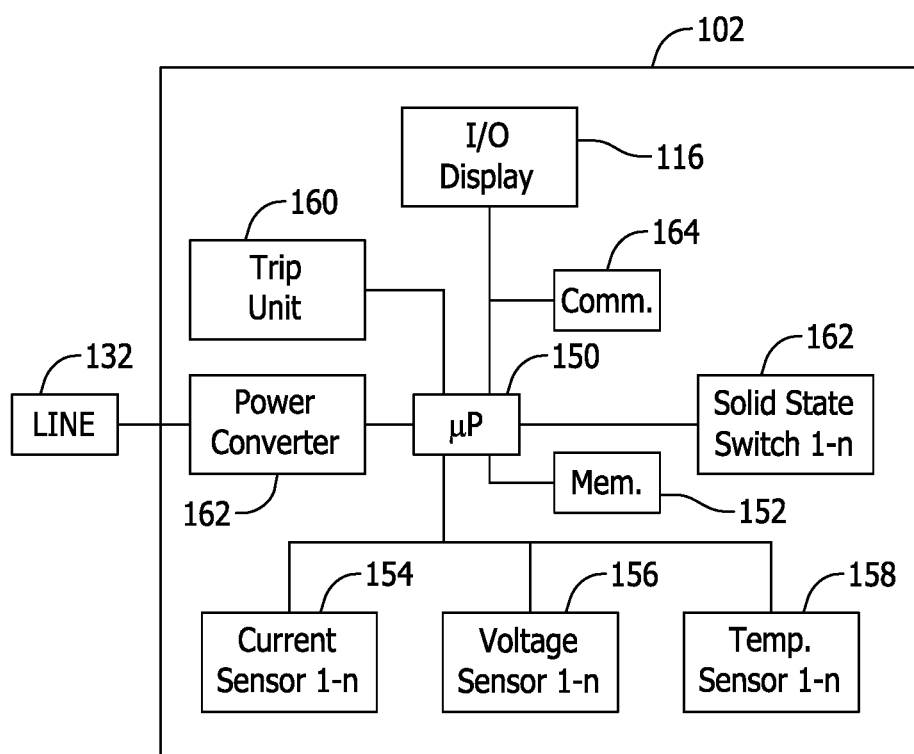
FIG. 3 is a block diagram of the circuit protection device shown in FIGS. 1 and 2.

FIG. 3 is a block diagram of the circuit protection device 100. The device 100 includes a processor-based microcontroller including a processor 150 and a memory storage 152 wherein executable instructions, commands, and control algorithms, as well as other data and information required to satisfactorily operate the device 100 are stored. The memory 152 of the processor-based device may be, for example, a random access memory (RAM), and other forms of memory used in conjunction with RAM memory, including but not limited to flash memory (FLASH), programmable read only memory (PROM), and electronically erasable programmable read only memory (EEPROM).

As used herein, the term "processor-based" microcontroller shall refer not only to controller devices including a processor or microprocessor as shown, but also to other equivalent elements such as microcomputers, programmable logic controllers, reduced instruction set (RISC) circuits, application specific integrated circuits and other programmable circuits, logic circuits, equivalents thereof, and any other circuit or processor capable of executing the functions described below. The processor-based devices listed above are exemplary only, and are thus not intended to limit in any way the definition and/or meaning of the term "processor-based".

The devices 100 also include sensors 154, 156, 158 provided in a number 1 through n that equals the number of switching poles in the device 100. As such, for the three pole device 100 shown in FIGS. 1 and 2, three sensors of each type may be included that respectively detect current, voltage and temperature at respective locations in the device to assess actual operating circuit conditions in the device. Additional temperature sensors may optionally be provided per switching pole in further embodiments for enhanced temperature monitoring at a plurality of location in each pole. The sensors 154, 156 and/or 158, in turn, provide inputs to the processor 150. Thus, the processor 150, by virtue of the sensors 154, 156 and/or 158, is provided with real-time information regarding current passing through each of the solid state devices 162 in number 1 through n that equal the number of switching poles in the device 100.

The detected current is monitored and compared to a baseline current condition, such as a time-current curve or time-current profile that is programmed and stored in the memory 152 or the trip unit 160. By comparing the detected current with the baseline current condition, decisions can be made by the processor 150 to control the solid state switching elements 162, by controlling an output voltage to the gate-emitter voltage in the IGBT's described above, to cease conducting current to protect the load-side from damaging currents. In some embodiments, the trip unit 160 allows the user to select settings for the operation of the trip unit 160 and alter the time-current response of the device 100 within predetermined limits. As one such example, a user may select a current rating of the device 100 at a value from 50A to 100A, with the trip unit 160 applying the appropriate time-current curve for the selected current rating.

The detected voltage may likewise be monitored and used to make control decisions whether to operate the solid state switching elements 162 to protect the load-side circuitry and components from adverse operating conditions. Since voltage and current are related, detected voltage can be compared to detected current to facilitate an assessment of the health of the device 100, identify errors, and facilitate diagnosis and troubleshooting of the electrical power system. As other failsafe measures, voltage and current can be calculated from sensed parameters and compared to the sensor feedback to detect error conditions.

The detected temperature may likewise be monitored and used to make control decisions whether to operate the solid state switching elements 162 to protect the load-side circuitry and components from adverse operating conditions. Additionally, the detected temperature may ensure that conductors in the device 100 are operating below rated temperatures for the particular hazardous location in which it resides. For example, if the rated temperature is 200° F., the processor 150 can operate the solid state switches to disconnect and cease current flow when the operating temperature as indicated by the temperature sensors has risen to near 200° F. that could ignite airborne gases, vapors or substances in the explosive environment.

The processor 150 is in communication with the input/output display 116 to provide feedback to a user and to accept inputs made via the display 116.

In the example shown, the processor 150 receives line-side power through power converter circuitry 162. The power converter circuitry 162 includes step down components and analog to digital conversion components when necessary to supply direct current (DC) power to the processor 150 at reduced voltage in a known manner. Conversion of the line power to appropriate levels to power the electronics avoids any need for an independent power supply, such as batteries and the like or a separately provided power line for the electronic circuitry and controls that would otherwise be necessary, although in some embodiments such an independent power supply may indeed be included if needed or as desired. The controls described may be implemented on a circuit board in various arrangements of electronic packages, with algorithmic control features programmed and stored in the device memory.

A communication element 164 is also included that may communicate data to a remote location to assess operation of the larger electrical power system. Wireless and non-wireless communication of data of interest, including but not limited to current data, voltage data (including waveform data), temperature data, on-off status data of the solid state switching elements, selected setting data, trip time data, etc. is possible, and such data may be stored and archived locally and remotely for analysis of the electrical power system over time. Remote actuation of the device 100 is also possible via the communication element 164.

While an exemplary architecture of the device 100 has been described, it is understood that certain of the elements shown in FIG. 3 may be considered optional to provide more basic functionality. Moreover, additional elements could be added to realize still further sophistication and intelligence in the operation of the device 100, as well as to provide additional functionality beyond circuit protection and disconnection functionality.

Figure 4:
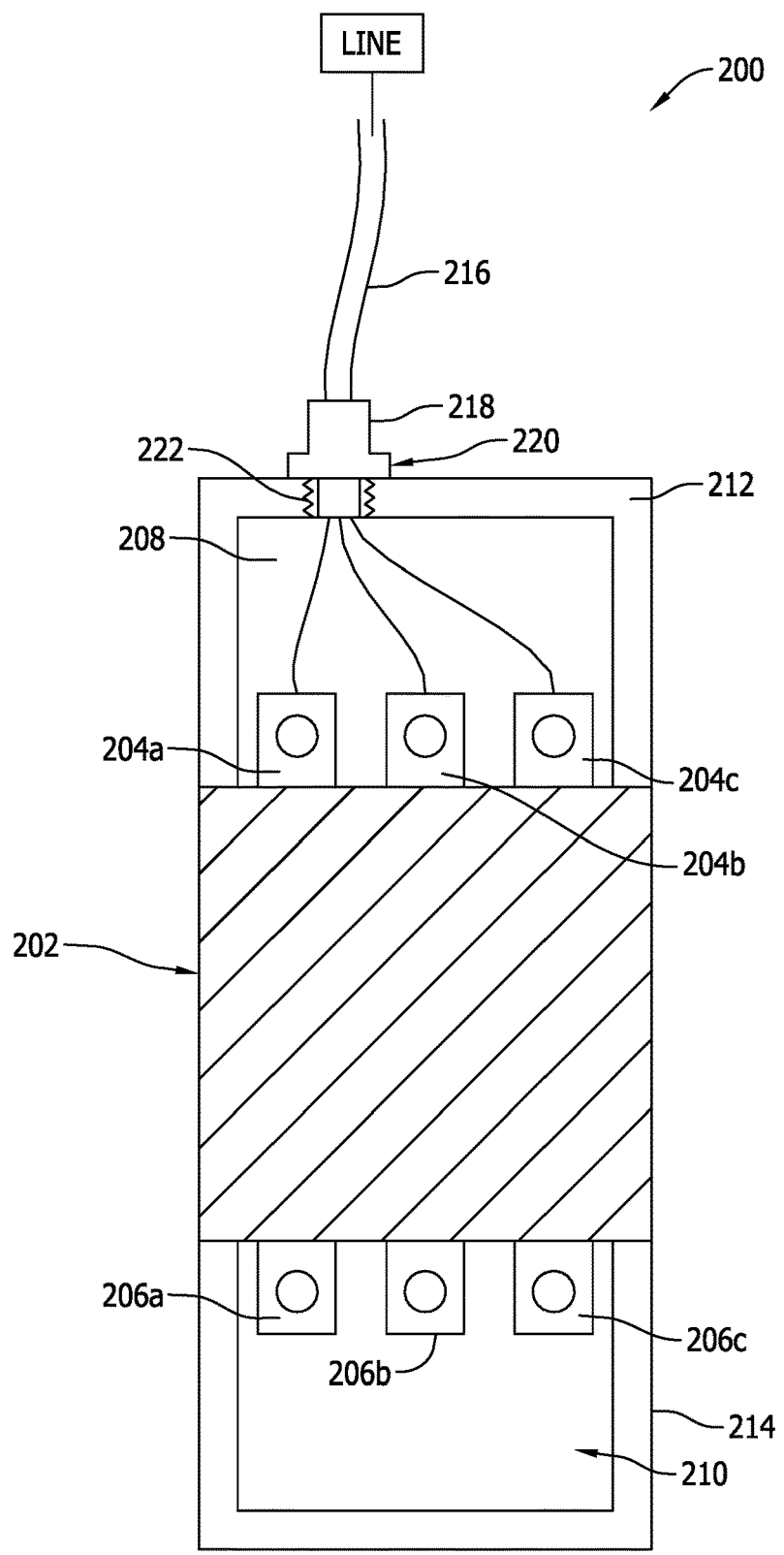
FIG. 4 is partial front elevational view of a second exemplary embodiment of a compliant, explosive location circuit protection device illustrating a secure cable termination assembly and technique.

FIG. 4 is a partial front elevational view of a second exemplary embodiment of a compliant, explosive location circuit protection device 200 illustrating a secure cable termination assembly and technique.

The device 200 includes a housing 202 including the solid state switches and control elements of the device 100 described above and shown in FIGS. 2 and 3. The display 116 (FIG. 1) of the device 100 is omitted in the exemplary device 200. A manual actuator for a user to turn the device "on" and "off" is not shown in FIG. 2 but is included in lieu of the display, although in another embodiment the display 116 may be incorporated if desired. The housing 202 is fabricated in view of the considerations described above for the housing 102 of the device 100, and the housing 102 contains the solid state switches which provide automatic overcurrent protection in the manner described above for the device 100 in an arc-less manner. Like the device 100, there is accordingly no ignition concern presented by the disconnect functionality of the device 200 when heat generated by the solid state switches is managed to operating temperatures below ignition point temperatures for the explosive location. The housing 202 may therefore be utilized in the explosive environment without an otherwise conventionally provided explosion-proof enclosure to address ignition concerns in the disconnect operation of a conventional device.

Line-side terminals 204a, 204b, 204c are accessible from a first side of the housing 202 and load-side terminals 206a, 206b, 206c are accessible from a second side of the housing 202 opposite the first side to establish the line-side and load-side connections through the solid state switching elements. Each of the line-side terminals 204a, 204b, 204c and the load-side terminals 206a, 206b, 206c may be, for example, a box lug terminal provided with a fastener such as a screw to clamp an end of a wire received in the box lug. Locking elements may be included in the lug terminals to ensure that connections to the terminals 204a, 204b, 204c, 206a, 206b, 206c will not loosen over time as the device 200 is subjected to vibration, thermal cycling or other demands of the explosive environment in which it is used. Spring-biased terminal arrangements and connector elements may likewise be utilized to ensure that the terminal connections are not compromised over time. Loose terminal connections should be avoided as they can generate heat and possible electrical arcing under certain conditions, and therefor present ignition concerns in the explosive environment.

As an added degree of assurance and safety for operation of the device 200 in the explosive environment, the line-side terminals 204a, 204b, 204c are enclosed in a first enclosure 208, and the load-side terminals 206a, 206b, 206c are enclosed in a second enclosure 210 on opposite sides of the housing 202. The enclosures 208, 210 are defined by respective housings 212, 214 that may be fabricated from materials such as those described above. The housings 212, 214 may be separately provided and assembled to the housing 202 or may be integrally formed and provided with the housing 202 as a unitary body construction. The housings 212, 214 may incorporate thermal management features described above to manage surface temperatures of the device 200 in use in the explosive environment. In some embodiments, the housings 212, 214 may be designed to meet explosion-proof standards, whereas the housing 202 may not be designed to meet explosion-proof standards, although the housing 202 could also be designed to meet explosion-proof standards if desired.

As shown in FIG. 4, line and load-side connections may be made to the terminals 204a, 204b, 204c or 206a, 206b, 206c inside the enclosures of the housings 212, 214 via, for example, an armored cable 216 and cable gland 218 on each end of the device 200. The cable gland 218 may include a base element or body 218 and a threaded post 222 that is received in a threaded aperture in the housing 212 as shown. The threaded engagement of the post 222 and the threaded aperture in the housing 212 meets the requirements of UL 1203 for use in an NEC Division 1 hazardous area. A locking nut 220 and a compression ring or O-ring sealing element is also provided, which is tightened around the diameter of the cable 216 via the locking nut 220. The cable gland 218 may accordingly contain any dangerous currents, sparks or flames that may occur inside the enclosure 208 and housing 212 and prevent such dangerous currents, sparks or flames from reaching the outside explosive environment. The cable gland 218 may be made from metal such as stainless steel, brass, or aluminum as well as may be made from plastic in different embodiments.

The cable gland 218 as illustrated beneficially provides ingress protection, sealing and grounding to safely pass the cable 216 through the enclosure 212. When used with armored cable 216, a ground-to-earth path may be established via the cable gland 218. Armored cable is not necessary in all embodiments, however, and may not be used. Cable glands 218 may be used with non-armored cable as well.

The cable gland 218 also facilitates strain relief when, as shown in the example of FIG. 4, the conductor strands of the cable 216 are separated inside the enclosure 208 with adequate room for any bending of the wires needed to make the connections to the terminals 204a, 204b, 204c. As seen in the example of FIG. 4, a single cable 216 includes three wire conductors that may carry a respective phase of a three-phase line-side power supply. In other embodiments, the cable 218 may include greater or fewer conductors to accommodate greater or fewer phases of the line-side power supply. Varying numbers of terminals 204a, 204b, 204c and solid state switching elements inside the enclosure 208 and housing 212 may likewise be provided in different embodiments. Likewise, multiple cables may be utilized with multiple cable glands to make the desired connections to the terminals 204a, 204b, 204c.

While FIG. 4 shows the cable 216 and cable gland 218 connection only on the line-side of the device 200, a similar cable and cable gland connection may be established on the load-side of the device via the terminals 206a, 206b, 206c in the enclosure 210 and housing 214.

Removable covers (not shown in FIG. 4) can be provided in order to allow access to the enclosures 208, 210 to make the connections to the line-side or load-side terminals either before or after the cable gland 218 is secured to the housing 212 or 214. The covers may be installed after the connections to the line-side or load-side terminal lugs are completed. In some instances, the enclosures 208, 210 could be vacuum sealed or filled with a dielectric fluid (e.g., oil) as further assurance that a spark or flame may not materialize in the enclosure 208 or 210, or at least to ensure that a spark or flame may not materialize easily in the enclosures 208, 210. The covers may be sealed to prevent environmental ingress and fastened with screws or otherwise securely latched so to ensure a proper flamepath between the enclosure and cover in cases that do not involve a dielectric fluid. Sand fillers, arc extinguishing fillers, or other known encapsulation techniques may be utilized to address possible arcing concerns within the device 200.

The device 200 can be safely operated in explosive environments without a conventionally provided, separate explosion-proof enclosure. To the extent that the housings 212, 214 (and the housing 202) may be explosion-proof, they can be provided relatively economically due to their relatively small size. The device 200 being chemically resistant and impact resistant can stand freely and openly in an explosive location. Non-explosion-proof sheet metal enclosures that are conventionally utilized to house circuit breakers are therefore not needed either. Elimination of a separate exterior enclosure presents further opportunity to integrate typical control devices and indicators into the device 200 without the need for costly and cumbersome auxiliary devices conventionally provided in the separately provided, exterior enclosure.

Figure 5:
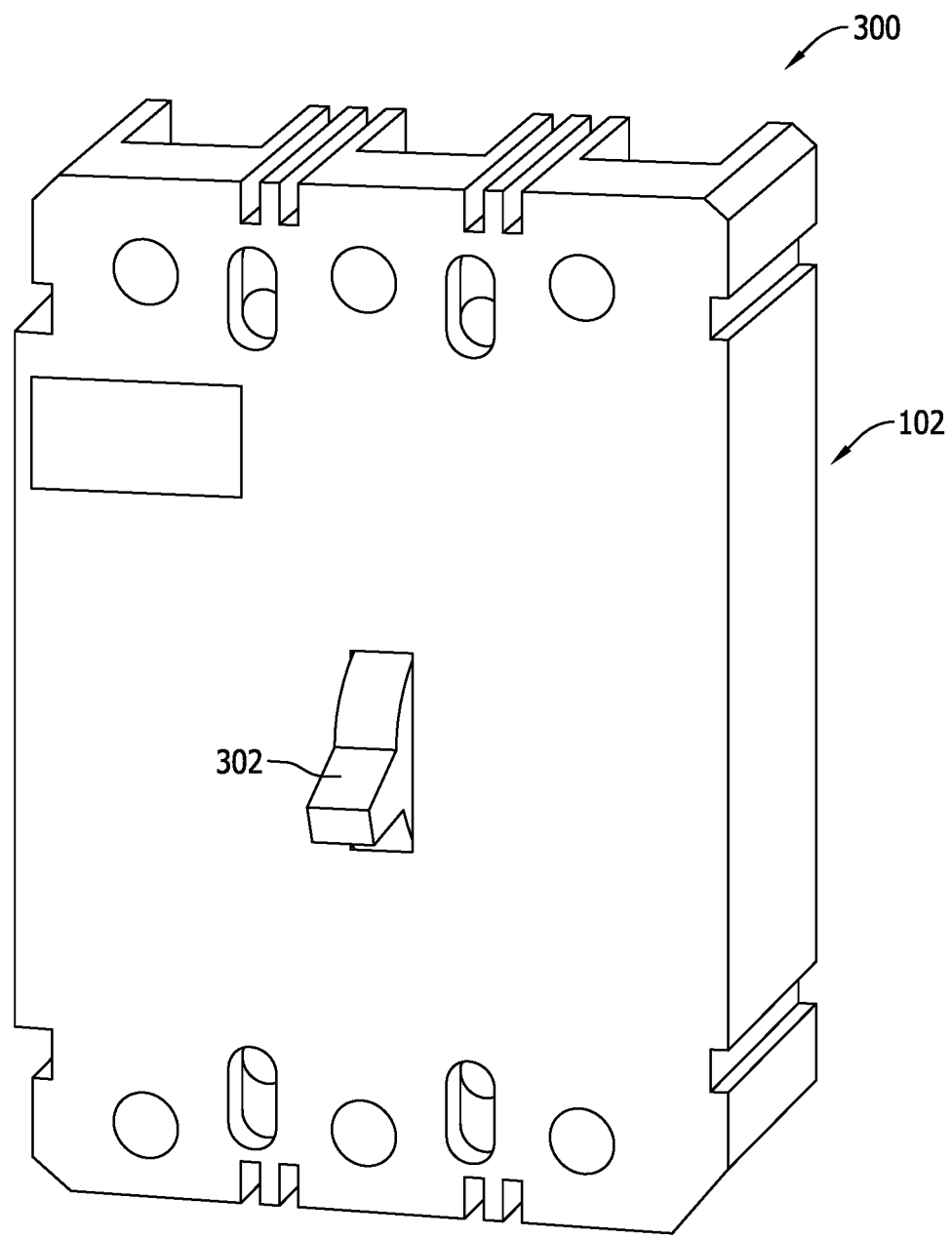
FIG. 5 is a perspective view of a compliant, explosive location circuit protection device according to a second exemplary embodiment of the invention.

FIG. 5 is a perspective view of a compliant, explosive location circuit protection device 300 according to a third exemplary embodiment of the invention. The circuit protection device 300 includes the housing 102 described having the chemical resistance, impact resistance and thermal management features described above in relation to the device 100, but omits the digital display 116 of the device 100 (FIG. 1). As shown in FIG. 5, a toggle switch 302 is accessible to a user on the upper face of the housing 102 for manual activation of the device 300 between "on" and "off" states to connect and disconnect the load-side of the device 300 from the line-side. Manual actuators other than toggle switches may be employed in other embodiments. In some cases, the display 116 could be provided in addition to or in lieu of the toggle switch 302 or another manual actuator.

Like the device 100, the device 300 may interconnect line-side or power supply circuitry and electrical loads operating via alternating current (AC) or direct current (DC). The device 300 as shown is configured as a circuit breaker and therefore provides automatic circuit protection in response to predetermined overcurrent conditions, which may be selected by the user within a certain range and input to the device a local or remote user interface, or otherwise pre-programmed into the device. The device 300 may operate according to specified time-current characteristics or time-current profiles suitable to provide adequate protection for connected loads, including but not necessarily limited to characteristics required for listing as a UL 489 circuit breaker in contemplated embodiments.

Figure 6:
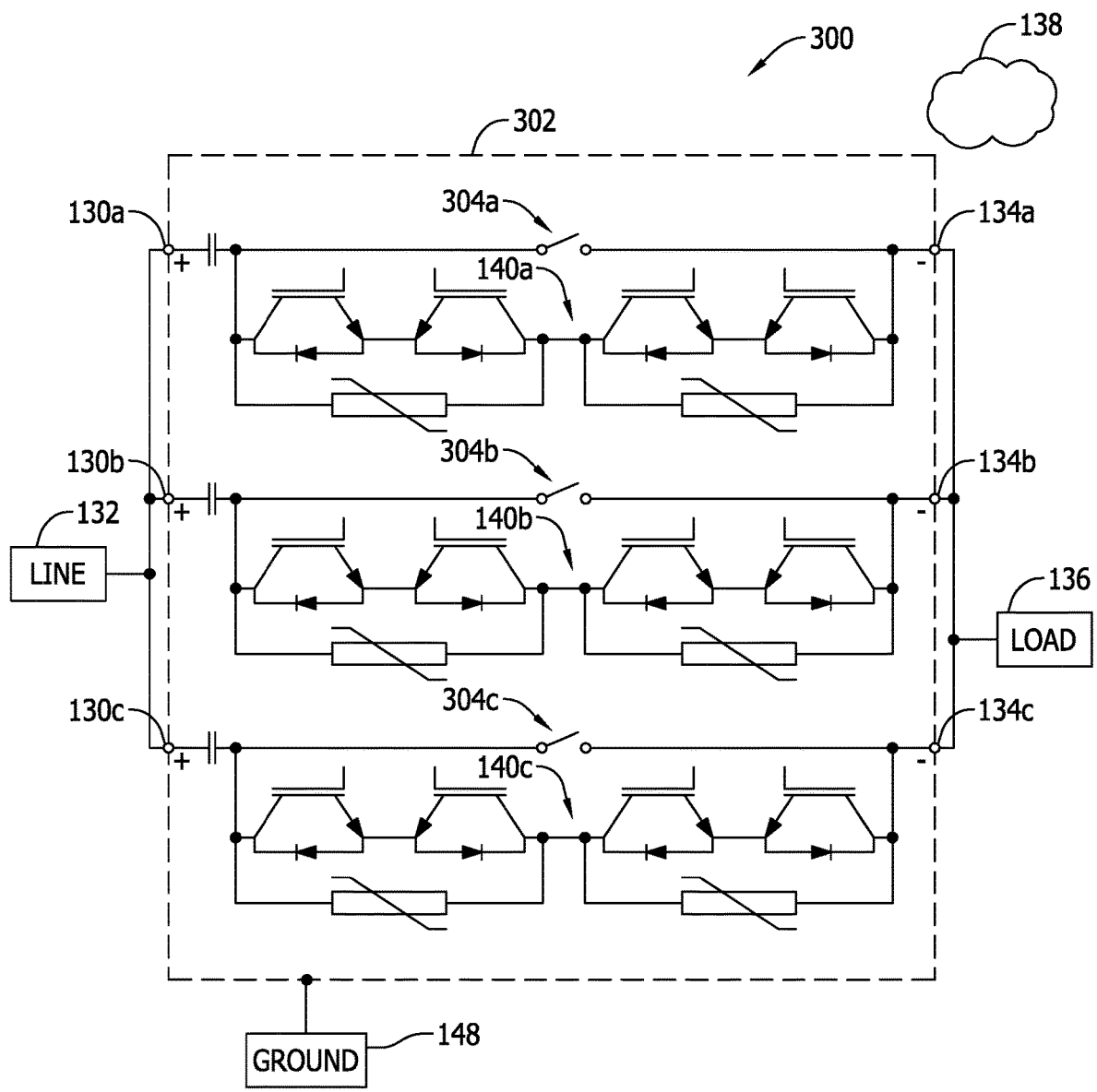
FIG. 6 is a simplified schematic diagram of the circuit protection device shown in FIG. 5 in an exemplary hybrid configuration.

FIG. 6 is a simplified schematic diagram of the circuit protection device 130 in an exemplary hybrid configuration. The device 300 includes input terminals 130a, 130b, 130c each connected to one phase of a three phase power supply indicated as line-side circuitry 132 via connecting cables or conduits. The device 300 further includes output terminals 134a, 134b, 136c each connected to load-side circuitry 136 such as motors, fans, lighting devices, and other electrical equipment in an industrial facility wherein ignitable gas, vapors or substances may be airborne as indicated at 138 to produce an explosive environment.

In between each pair of input terminals 130a, 130b, 130c and output terminals 134a, 134b, 136c are mechanical circuit breakers 304a, 304b, 304c and parallel connected solid state switch devices arranged as indicated at 140a, 140b and 140c. The exemplary solid state switch arrangement 140a, 140b, 140c includes series connected pairs of insulated-gate bipolar transistors (IGBTs) with each pair including a varistor element connected in parallel to the IGBTs as described above. While exemplary solid state switching arrangements are shown and described, others are possible to achieve solid state switching functionality in an arc-less manner. As discussed above, the solid state switching devices operate in an arc-less manner and therefore do not themselves present a risk of ignition insofar as arcing is concerned in an explosive atmosphere.

The combination of the mechanical circuit breakers 304a, 304b, 304c and the solid state switching arrangements 140a, 140b and 140c can improve response times of the device 300 relative to that of the device 100. The mechanical circuit breakers 304a, 304, 304c however, operate with mechanical switch contacts and accordingly deserve some attention to a hazardous location application as arcing can be an ignition source. The solid state switching arrangements 140a, 140b and 140c that are connected in parallel to the mechanical circuit breakers 304a, 304b, 304c can limit the current in mechanical circuit breakers 304a, 304, 304c in an overload or short circuit event to reduce intensity of any arc produced to a level below that required to present an ignition concern, or otherwise preclude arcing altogether.

The device 300 is likewise connected to electrical ground 148 to dissipate any charging of the housing surface as described above, thereby precluding a possible ignition source via static discharge as described above. The line and load-side connections may be established using any of the secure terminal assemblies described above, including but not limited to armored cable and cable glands to provide enhanced safety assurance for explosive environments.

In contemplated embodiments, the housing 102 of the device 300 may be fabricated from metallic or non-metallic materials. In some cases involving certain metallic or non-metallic materials, strategic selection of housing materials, filler materials and encapsulant materials is necessary in order to address static electricity concerns. Combinations of conductive and non-conductive materials, both internal to the device 300 and external to the device 300 may be utilized to provide paths to electrical ground as appropriate.

Figure 7:
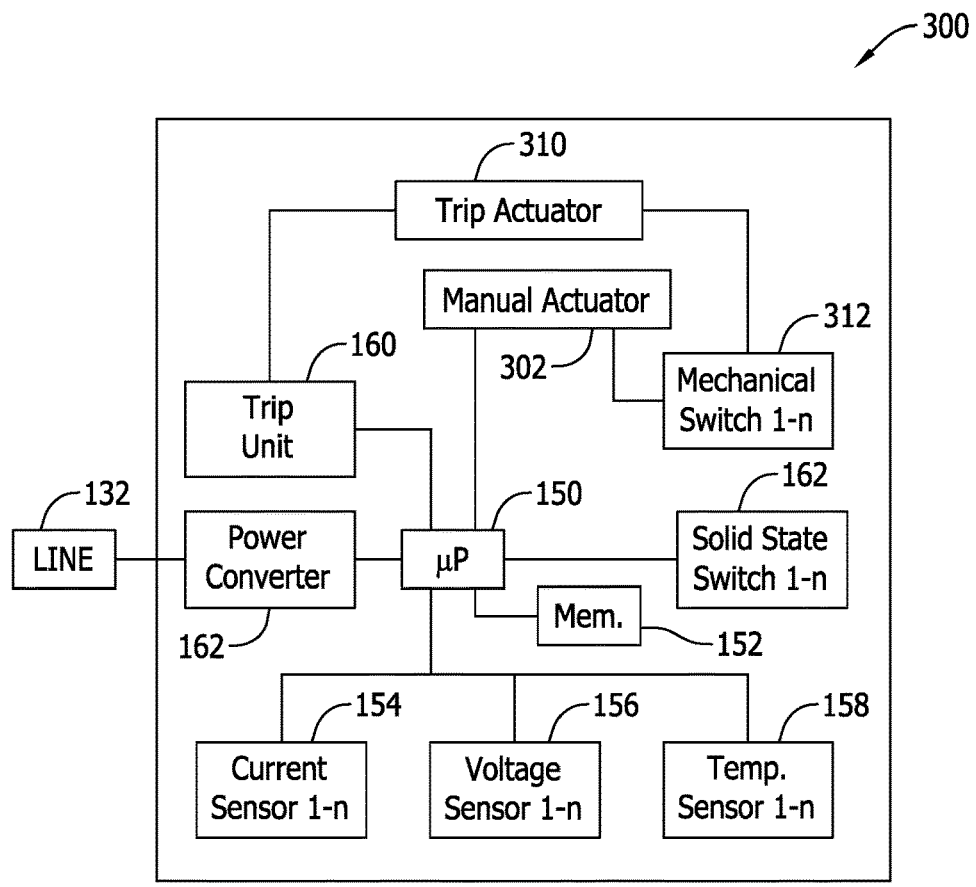
FIG. 7 is a block diagram of the circuit protection device shown in FIGS. 5 and 6.

FIG. 7 is a block diagram of the circuit protection device 300 including, in addition to the elements described above in the device 100, control inputs for the manual actuator 302, and a trip actuator 310 for operating the mechanical circuit breakers 312 including the mechanical switches. When predetermined overcurrents are detected, the trip unit 160 causes the trip actuator 310 to displace the movable switch contacts and open the circuit through the device 300. The trip actuator may be an electromagnetic member such as a solenoid that can simultaneously displace the switch contacts of each mechanical breaker provided in the device 300, with the solid state switching arrangements 140a, 140b and 140c limiting the current as the displacement of the switch contacts occurs. The manual actuator 302 can thereafter be used to reset the device 300 by closing the mechanical switches.

While an exemplary device architecture has been described, it is understood that certain of the elements shown in FIG. 7 may be considered optional to provide more basic functionality, as well as additional elements could be added to realize still further sophistication and intelligence in the operation of the device 300.

Figure 8:
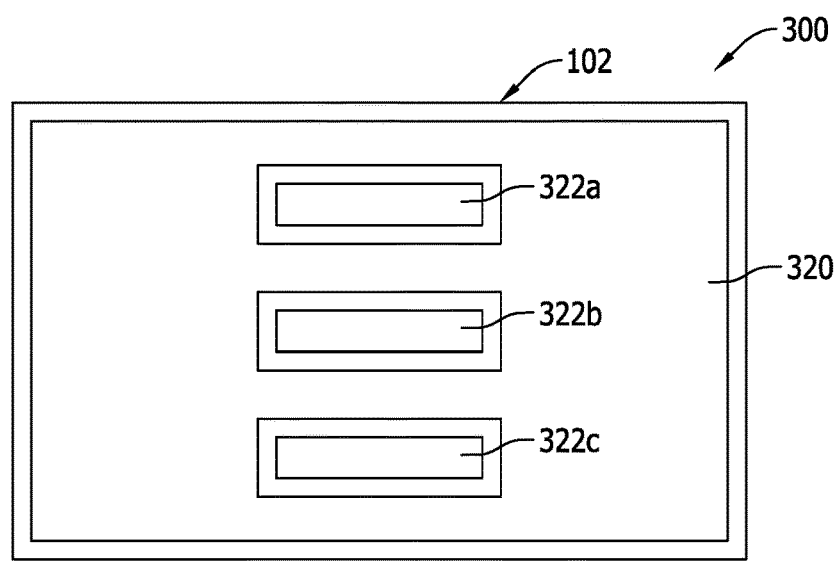
FIG. 8 diagrammatically illustrates thermal management features for the circuit protection device shown in FIGS. 5 through 7.

FIG. 8 diagrammatically illustrates thermal management features for the circuit protection device shown in FIGS. 5 through 7. While as described above the hybrid device 300 is capable of operating in an arc-less manner in many instances, since arcing can depend on the nature of an electrical fault and the voltage and current of the operating power system at the time of the electrical fault, additional considerations to address any arcing that is realized must be considered.

As shown in FIG. 8, and in addition to the thermal management features described above in relation to the device 100, the device 300 includes additional features to ensure that any arcing that occurs in operation of the mechanical circuit breakers is isolated from the ambient environment or otherwise is reduced to a level that is insufficient to cause ignition in an explosive location. FIG. 8 illustrates the housing 102 of the device 300 defining a first or primary enclosure 320 and a series of secondary enclosures 322a, 322b, 322c. The secondary enclosures 322 serve to contain an any electrical arcing within the secondary enclosure while ensuring that airborne ignitable gases, vapors or substances cannot reach the secondary enclosures 322a, 322b, 322c and therefore cannot be ignited by operation of the mechanical switch contacts.

In contemplated embodiments, the secondary enclosures 322a, 322b, 322c may be hermetically sealed chambers that include the respective switch contacts. The hermetically sealed chambers 322a, 322b, 322c are fluid tight such that any ignitable element of the hazardous location that may penetrate the housing 102 into the primary enclosure 102 cannot enter the sealed chambers 322a, 322b, 322c. The hermetically sealed chambers may further be vacuum chambers or filled with inert gas that would reduce arcing intensity and duration, if not avoiding arcing altogether as the switch contacts are opened and closed. Each of the secondary enclosures 322a, 322b, 322c may be provided with additional insulation and material to contain any heat associated with arcing and localize it to the secondary enclosures 322a, 322b, 322c inside the larger enclosure 320. The enclosure within an enclosure construction of the body 102 accommodates the other thermal management features described above, while addressing the additional concerns of the mechanical switch contacts in the explosive environment.

The secondary enclosures 322a, 322b, 322c may be fabricated from different materials than the rest of the housing 102, or a combination of materials that may be the same or different from the remainder of the housing. Metal and plastic materials may be utilized, for example, to construct the chambers while the primary enclosure and the rest of the housing may be entirely plastic. Numerous variations are possible in this regard. The secondary enclosures 322a, 322b, 322c may be prefabricated for assembly with the housing 102 at a separate stage of manufacture. The secondary enclosures 322a, 322b, 322c may enclose some or all of the mechanical circuit breaker mechanism, without impeding the path of motion of the switch contacts or their ability to move.

Any of the devices 100, 200 or 300 may be safely used in NEC Division 1 hazardous locations, without separately provided explosion-proof enclosures. The built-in ignition protection features described above either eliminate ignition sources or reduce them to levels that are insufficient to cause ignition. The devices 100, 200 or 300 are therefore sometimes referred to as being ignition-protected and therefore eliminate any need for a separate explosion-proof enclosure. As such, the devices 100, 200 and 300 prevent the possible explosion that the explosion-proof enclosure conventionally exists to safely contain. The devices 100, 200 and 300 can accordingly safely operate in explosive locations and obviate costs and burdens of conventional explosion-proof enclosures while saving space in the electrical power system.

Figure 9:
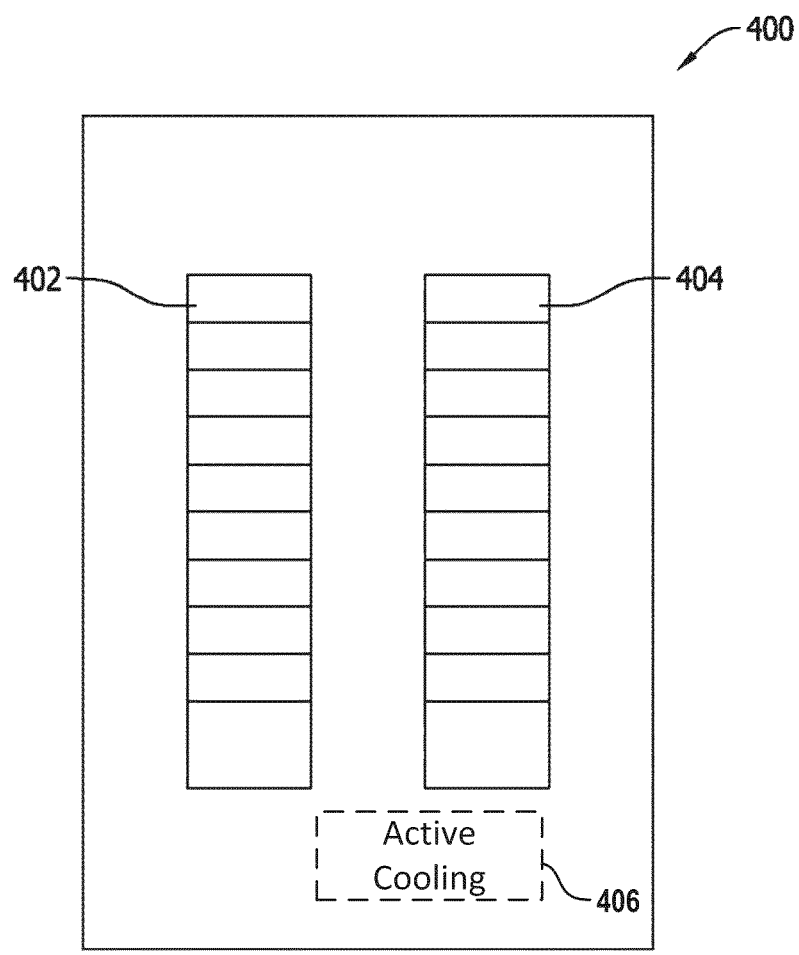
FIG. 9 illustrates an exemplary panelboard including compliant, explosive location circuit protection devices.

FIG. 9 illustrates an exemplary panelboard 400 including compliant, explosive location circuit protection devices including an array of devices 402, 404 arranged as two columns of devices. The devices 402, 404 in each column include the devices 100, 200 or 300 described above, and the devices 402, 404 may be represented in different ratings offering differing degrees of circuit protection to the various different loads served by the panel and its various branches. The panelboard 400 typically includes its own enclosure, but because of the ignition protected devices described utilized on the panelboard it can be a standard environmental enclosure that is not designed to be explosion-proof. Because the devices 402, 404 are ignition protected, they can reside in the panel enclosure without conventional explosion-proof enclosures in the panel enclosure either. The panel enclosure provides some protection to the devices 402, 404 from environmental conditions, but no-explosion-proofing is needed by virtue of the ignition-protected devices 402, 404. Considering that known panelboards may accommodate up to 84 devices, elimination of the separately provided individual and collective explosion-proof enclosures lowers costs substantially for operation of the devices 402, 404 in hazardous locations. The costs are multiplied even further for large electrical power systems including a number of panelboards located at different locations. In contemplated embodiments, the panelboard 400 may also be a single integrated circuit device with multiple programmable channels to accommodate a desired combination of single, two and three pole circuits.

The thermal management concerns are multiplied in such a panelboard installation including numerous devices 402, 404 operating simultaneously and in close proximity to one another. Heat effects can accumulate and adjacent devices may run hotter (i.e., with higher surface temperatures) than they would if used individually, or at least spaced farther apart from one another. The devices 402, 404 in the upper portions of the columns may further run hotter than devices 402, 404 in the lower portions of the disclosure as the heat rises from the lower situated devices 402, 404. In some instances then, active cooling features and systems may be advisable to avoid undesirable temperature effects on the operation some of the devices 402, 404 or to address elevated surface temperatures. As mentioned above, an active cooling system 406 could be provided on or in relation to the panelboard to cool devices 402, 404 at a systems level, as opposed to individually. Variations and combinations of active cooling elements and systems are possible to achieve different cooling effects.

While a panelboard and panelboard enclosure are described above for the devices 400, 402, similar benefits may be realized in motor control centers and other locations in an electrical power system wherein circuit protection devices 402, 404 are likewise located in non-explosion-proof enclosures. Considering the sensors and intelligence provided in the devices 402, 404 and motor-inrush features provided in the devices 402, 404 additional motor startup components could be integrated in the design of the devices 402, 404 and provide a combination circuit protector/motor starter in a single package, as opposed to conventionally provided, separately packaged and series connected circuit protectors and motor starter assemblies that each require explosion-proof enclosures for use in hazardous locations. Other dual purpose or dual function devices 400, 402 are likewise possible that reduce costs of installing and servicing electrical power systems even further by reducing the number of devices that need to be acquired, installed, and serviced in the power system.

The solid state or hybrid devices such as those described above may be constructed using various different solid state switching elements, arrangements of solid state switching elements, and also implemented in various different power electronics topologies. Various different embodiments are contemplated involving varying degrees of on-state loss, propensity to arcing in operation, conduction loss, component count, relative complexity, ability to meet specific response time characteristics, simplicity or complexity of operating algorithms, and ability to integrate motor soft-starting or other features when desired. Solid state switching elements can be connected in series or in parallel to achieve desirable voltage rating scaling or desirable current rating scaling using modular arrangements. To the extent that by-pass contacts are desirably implemented, encapsulation materials and thermal management features for the by-pass contact(s) provided may be advisable.

Any of the solid state and hybrid switch arrangements shown and described above may include or be connected to line-side electrical fuses to enhance circuit protection assurance by addressing any deficiency of the solid state switching elements with respect to certain overcurrent conditions or to improve response times to certain operating conditions.

The chemical and impact resistance housing construction, arc-free operation, secure terminal assemblies and thermal management features described above can easily be applied to realize circuit protection devices that are not circuit breaker devices, but are nonetheless ignition protected for use in NEC Division 1 hazardous locations, without explosion-proof enclosures. For example fusible switch disconnect devices are discussed above that include mechanical switches in combination with fuses. Applying the chemical, static discharge and impact resistant housing constructions, arc-free switching operation, secure terminal assemblies and thermal management features described, a solid state fusible switch disconnect device or a hybrid fusible switch disconnect device can easily be constructed with similar benefits, but offering a different degree of circuit protection.

Likewise, the chemical, static discharge and impact resistant housing construction, arc-free switching operation, secure terminal assemblies and thermal management features described above can easily be applied to realize switching devices that do not themselves provide circuit protection, but are nonetheless ignition protected for use in NEC Division 1 hazardous locations, without explosion-proof enclosures. For example, mechanical relay switches and contactors are known that provide disconnection functionality without capability to protect against overcurrent conditions. Applying the chemical and impact resistant housing construction, arc-free switching operation, secure terminal assemblies and thermal management features described, a solid state relay device or a hybrid relay device, and a solid state contactor device or a hybrid contactor device can easily be constructed for safe operation in an explosive environment.

Ignition protected devices such as those described can be provided with any desired number of switching poles, including for example only single pole devices, two pole devices, three pole devices, and four pole devices to accommodate the needs of any type of power system, including multiphase power systems and polyphase power systems, while universally providing ignition protection for use in NEC Division 1 hazardous locations.

Having described devices and applicable operating algorithms functionally per the description above, those in the art may accordingly implement the algorithms via programming of the controllers or other processor-based devices. Such programming or implementation of the algorithmic concepts described is believed to be within the purview of those in the art and will not be described further.

The benefits and advantages of the inventive concepts are now believed to have been amply illustrated in relation to the exemplary embodiments disclosed.

An embodiment of a compliant switch device for an explosive environment has been disclosed. The compliant switch device includes a housing that is fabricated to exhibit chemical resistance in the explosive environment, a line-side terminal and a load-side terminal coupled to the housing and being enclosed to provide ignition protected terminations in the explosive environment, and a bus structure in the housing and including at least one solid state switching element operable in an arc-free manner to connect the load-side terminal to the line-side terminal and disconnect the load-side terminal from the line-side terminal, whereby the switch device is compliant for use in the explosive environment without requiring a separately provided explosion-proof enclosure.

Optionally, the housing is further fabricated to exhibit antistatic properties in the explosive environment. The housing may also be configured to be electrically grounded. The housing may further be configured and designed to operate at a surface temperature at or below a rated temperature for the explosive environment, thereby precluding the housing from being an ignition source in the explosive environment. A controller may also be provided, with the controller configured to operate the at least one solid state switching element to maintain the surface temperature at or below the rated temperature, thereby precluding the housing from being an ignition source in the explosive environment.

The compliant switch device may also include at least one mechanical switch contact in the bus structure, with the housing including a sealed internal enclosure containing the at least one mechanical switch contact, thereby precluding the at least one mechanical switch contact from being an ignition source in the explosive environment.

The ignition protected terminations of the compliant switch device may a cable gland and an armored cable. The line-side and load-side terminal may each include a lug terminal and a fastener.

The line-side and load-side terminal may each be respectively enclosed in portions of the housing. The portions of the housing may be explosion proof. The portions of the housing may be sealed. The portions of the housing may be vacuum sealed. The portions of the housing may be filled with a dielectric fluid.

The compliant switch may further include an active cooling element or a passive cooling element. The at least one solid state switching element may be encapsulated. The ignition protected switch may include a controller controller configured to provide motor starter and overload control. The ignition protected switch device may be configured as a solid state circuit breaker or may be configured as a hybrid circuit breaker.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An ignition protected switch device for an explosive environment, the ignition protected switch device comprising: a housing defining a first enclosure and a second enclosure positioned on opposite sides of the housing, wherein the first and second enclosures are integrally formed with the housing; a line-side terminal and a load-side terminal coupled to the housing and being enclosed to provide ignition protected terminations in the explosive environment, wherein the line-side terminal is enclosed in the first enclosure and the load-side terminal is enclosed in the second enclosure; and a bus structure in the housing and including at least one solid state switching element operable in an arc-free manner to connect the load-side terminal to the line-side terminal and disconnect the load-side terminal from the line-side terminal; wherein the first enclosure and the second enclosure are vacuum sealed.

2. The ignition protected switch device of claim 1, wherein the housing is configured to be electrically grounded.

3. The ignition protected switch device of claim 1, further comprising a controller configured to operate the at least one solid state switching element to maintain a surface temperature at or below a rated temperature, thereby precluding the housing from being an ignition source in the explosive environment.

4. The ignition protected switch device of claim 1, further comprising at least one mechanical switch contact in the bus structure, and the housing including a sealed internal enclosure containing the at least one mechanical switch contact, thereby precluding the at least one mechanical switch contact from being an ignition source in the explosive environment.

5. The ignition protected switch device of claim 1, wherein the ignition protected terminations comprise a cable gland.

6. The ignition protected switch device of claim 5, wherein the ignition protected terminations further comprise an armored cable.

7. The ignition protected switch device of claim 5, wherein the line-side and load-side terminals each comprises a lug terminal and a fastener.

8. The ignition protected switch device of claim 1, wherein the first enclosure and the second enclosure are explosion proof.

9. The ignition protected switch device of claim 1, wherein the first enclosure and the second enclosure are sealed.

10. The ignition protected switch device of claim 1, wherein the first enclosure and the second enclosure are filled with a dielectric fluid.

11. The ignition protected switch device of claim 1, further comprising an active cooling element.

12. The ignition protected switch device of claim 1, further comprising a passive cooling element.

13. The ignition protected switch device of claim 1, wherein the at least one solid state switching element is encapsulated.

14. The ignition protected switch device of claim 1, wherein the housing is a unitary body construction.

15. The ignition protected switch device of claim 1, wherein the ignition protected terminations include a plurality of line-side terminals positioned apart from one another and a cable extending through the housing, the cable including separate strands electrically connected with corresponding ones of the plurality of line-side terminals.

16. The ignition protected switch device of claim 5, wherein the cable gland further includes a threaded post, the housing defining a threaded aperture sized to receive the threaded post therein.

17. The ignition protected switch device of claim 1, wherein the housing is fabricated to exhibit chemical resistance in the explosive environment.

18. An ignition protected switch device for an explosive environment, the ignition protected switch device comprising: a housing defining a first enclosure and a second enclosure positioned on opposite sides of the housing, wherein the first and second enclosures are integrally formed with the housing; a line-side terminal and a load-side terminal coupled to the housing and being enclosed to provide ignition protected terminations in the explosive environment, wherein the line-side terminal is enclosed in the first enclosure and the load-side terminal is enclosed in the second enclosure; and a bus structure in the housing and including at least one solid state switching element operable in an arc-free manner to connect the load-side terminal to the line-side terminal and disconnect the load-side terminal from the line-side terminal; further comprising a controller configured to operate the at least one solid state switching element to maintain a surface temperature at or below a rated temperature, thereby precluding the housing from being an ignition source in the explosive environment.

* * * * *